(12) United States Patent
Frederick, Jr.

(10) Patent No.: US 8,456,214 B2
(45) Date of Patent: Jun. 4, 2013

(54) STATE RETENTION CIRCUIT AND METHOD OF OPERATION OF SUCH A CIRCUIT

(75) Inventor: Marlin Wayne Frederick, Jr., Austin, TX (US)

(73) Assignee: ARM Limited, Cambridge (GB)

( * ) Notice: Subject to any disclaimer, the term of this patent is extended or adjusted under 35 U.S.C. 154(b) by 99 days.

(21) Appl. No.: 12/926,375

(22) Filed: Nov. 12, 2010

(65) Prior Publication Data
US 2011/0121876 A1 May 26, 2011

Related U.S. Application Data

(60) Provisional application No. 61/262,029, filed on Nov. 17, 2009.

(51) Int. Cl.
*H03K 3/356* (2006.01)
(52) U.S. Cl.
USPC ............ 327/208; 327/210; 327/215; 327/218
(58) Field of Classification Search
USPC ................ 327/199–203, 208, 210–212, 214, 327/215, 218
See application file for complete search history.

(56) References Cited

U.S. PATENT DOCUMENTS
7,411,413 B2 * 8/2008 Shimazaki et al. ........... 327/199

OTHER PUBLICATIONS

Shi, "Area and Power-Delay Efficient State Retention Pulse-triggered Flip-flops with Scan and Reset Capabilities", *IEEE 2008*, pp. 170-175.

* cited by examiner

*Primary Examiner* — Long Nguyen
(74) *Attorney, Agent, or Firm* — Nixon & Vanderhye P.C.

(57) ABSTRACT

A state retention circuit is provided comprising a pulse generator which is configured in a non-retention mode of operation to be responsive to a clock signal to periodically assert a pulse, and a storage structure that comprises a storage element for storing state and an isolation structure for responding to the asserted pulse. In particular, the isolation structure is responsive to the asserted pulse to cause the storage element to update its stored state dependent on an input to the storage structure. Conversely, in the absence of the asserted pulse, the isolation structure isolates the storage element from the input. The pulse generator can be driven by a retention control signal to enter a retention mode of operation, during which it does not assert the pulse irrespective of changes in the clock signal. As a result, the isolation structure isolates the storage element from the input during the retention mode of operation, causing the storage element to retain its stored state prior to entry of the retention mode of operation irrespective of changes in the clock signal or changes in the input during the retention mode of operation. Such a design provides a clock independent pulse retention storage structure of small area, high performance and low energy consumption.

16 Claims, 8 Drawing Sheets

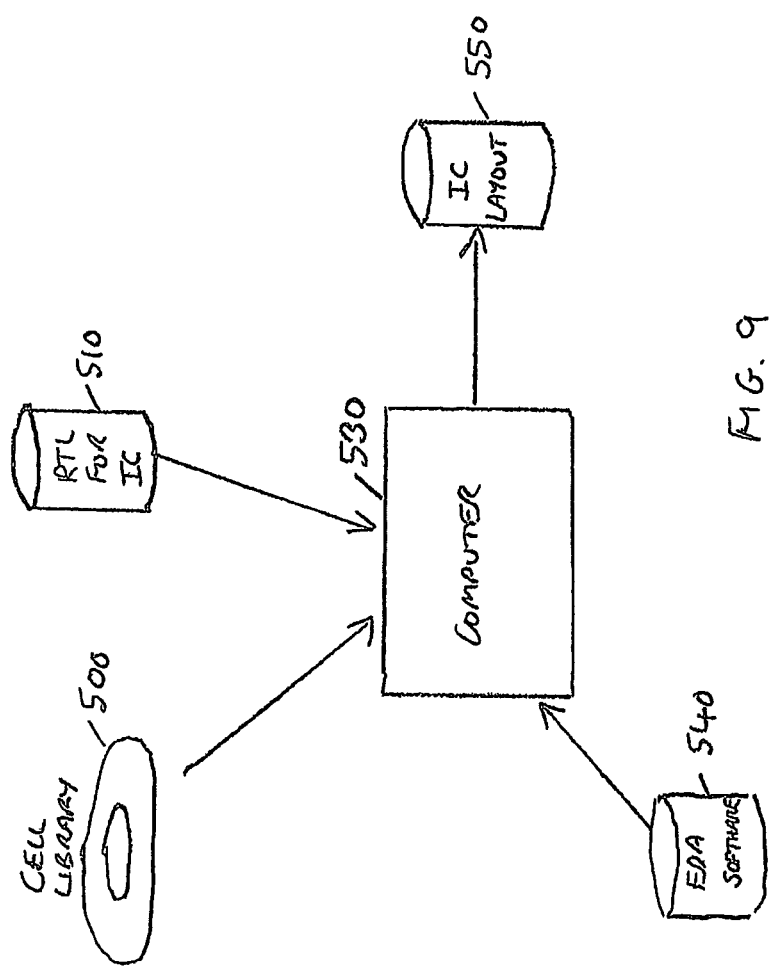

STATE RETENTION CIRCUIT AND METHOD OF OPERATION OF SUCH A CIRCUIT

This application claims priority to U.S. Provisional Application No. 61/262,029, filed Nov. 17, 2009, the entire contents of which are hereby incorporated by reference.

BACKGROUND OF THE INVENTION

1. Field of the Invention

The present invention relates to a state retention circuit and a method of operation of such a state retention circuit.

2. Description of the Prior Art

Sequential storage circuits that store data in response to a clock signal in data processing circuits are known. These circuits include latch circuits and flip flops and are very important elements of a processing circuit from both a delay and energy standpoint. Flip flops can take the form of master-slave latches which input the data to the master latch during the first phase of the clock cycle and transfer it to the slave latch during the second phase of the clock cycle. This makes them look as though they store data in response to an edge, in other words they appear edge triggered.

An alternative design to these master-slave flip flops is a pulse triggered flip flop which stores data in a single latch in response to a pulse. If the pulse is small and occurs on the edge of the clock it also looks as though the storage element or latch is edge triggered. In effect the latch is transparent when the pulse is high so the storage element can receive the data during the pulse, and is then opaque when the pulse is low so that it is isolated from the input. However, the pulse must be wide enough for the storage element to be able to react during the pulse width and store the data, and not too wide as otherwise the data may "race" through the storage element before it is latched causing potential state errors in downstream circuits.

As process geometries shrink, power consumption is becoming a significant issue. In particular, as threshold voltages reduce, there is an increase in leakage current which gives rise to significant power consumption issues, particularly in battery-powered applications.

Power-gating is one of the most effective methods to reduce chip power. In accordance with such techniques, inactive blocks are shut down by turning off power supplies to those blocks through switch cells. Whilst critical state of the design can be shifted out and saved in memory before the power is removed from such blocks, and then retrieved from the memory at block wakeup time, this state saving and restoring process can give rise to significant performance degradation.

Accordingly, in order to enable rapid resumption of operations from a power-gated mode, many power-gating designs implement state retention storage structures which are able to retain state during a low power mode, so that at wakeup time the retained state is quickly available to allow resumption of operation. The earlier mentioned master slave flip-flops and/or pulse triggered flip-flops can be configured to provide such state retention storage circuits.

Often flip-flops which possess a retention mode require the input clock to be stopped in a specific state prior to the retention mode being entered, and to be in the same specific state when the retention mode is exited. If these conditions are not met, the flip-flop can fail to maintain the same state during the retention mode and subsequent exit from the retention mode. Such flip-flops are often referred to as clock dependent retention flip-flops, and designs for such clock dependent retention flip-flops are quite common. However, such clock dependent retention flip-flops place significant constraints upon the design through their requirement for the clock signal to be in a specific state on both entry to, and exit from, the retention mode.

Accordingly, it would be desirable to provide a retention storage structure where the input clock could be in any of the valid clock states when the retention mode is entered and be in any of the valid clock states when the retention mode is exited, whilst still ensuring that the state retained in the storage structure is not corrupted during the retention mode. Flip-flops which provide such functionality are referred to as clock independent retention flip-flops. In particular, such clock independent retention flip-flops are able to output, on exit from the retention mode, the same state that was stored just prior to entry of the retention mode, for all of the four possible combinations of entry and exit clock states indicated below:

| CLOCK STATE WHEN ENTERING RETENTION MODE | CLOCK STATE WHEN EXITING RETENTION MODE |
| --- | --- |
| 0 | 0 |
| 0 | 1 |
| 1 | 0 |
| 1 | 1 |

The state retained in a clock independent retention flip-flop should also remain uncorrupted irrespective of transitions in the clock that occur during the retention mode.

When the flip-flop is in retention mode, the power to various circuits, including for example the portions of the flip-flop which do not store the state, may be removed. When the power is removed this is referred to as a power down state (also referred to herein as a low power mode of operation). Both clock dependent and clock independent retention flip-flops must not modify the internal state of the flip-flop throughout the power down and retention sequence, and must not modify the state of the flip-flop during the transition from retention mode to non-retention (normal) mode. It has proved difficult to achieve these characteristics for clock independent retention flip-flops with designs that are simple enough to implement in a typical layout. Often, the earlier mentioned master-slave latch form of flip-flops have been used as the basis for implementations, and laying out such designs is often impossible in small cell heights.

The article "Area and Power-Delay Efficient State Retention Pulse-Triggered Flip-Flops with Scan and Reset Capabilities" by K Shi, Pages 170 to 175, IEEE International Conference on Computer Design, 2008, 12 to 15 Oct. 2008, discusses various designs of area and power-delay efficient state retention pulsed flops. FIG. 2 of that document illustrates a clock independent retention flip-flop based on a pulse triggered flip-flop. In accordance with the discussed design, additional isolation devices are added to the data path to block the ability of the generated pulses to vary the data in the storage element during retention mode. However, such an approach adversely affects performance, due to the insertion of additional devices along the data path, and also exhibits power consumption problems due to the continued operation of the pulse generator, the driving of the additional isolation devices, etc.

It would accordingly be desirable to provide an improved design of clock independent retention storage structure.

SUMMARY OF THE INVENTION

Viewed from a first aspect, the present invention provides a circuit comprising: a pulse generator configured in a non-retention mode of operation to be responsive to a clock signal to periodically assert a pulse; a storage structure comprising a storage element for storing state and an isolation structure, said isolation structure being responsive to said asserted pulse to cause said storage element to update its stored state dependent on an input to said storage structure, and in the absence of said asserted pulse to isolate said storage element from said input; said pulse generator being responsive to a retention control signal to enter a retention mode of operation, during said retention mode of operation said pulse generator being configured to not assert the pulse irrespective of changes in said clock signal; whereby said isolation structure isolates said storage element from said input during said retention mode of operation, causing said storage element to retain its stored state prior to entry of the retention mode of operation irrespective of changes in said clock signal or changes in said input during said retention mode of operation.

In accordance with the present invention, a clock independent retention storage structure is provided, which is based on a pulsed storage structure. The proposed solution hence provides a design for a clock independent retention storage structure which has a small area when compared with known techniques. Further, the solution provides for improved power consumption when compared with the prior art described in the earlier-mentioned article "Area and Power-Delay Efficient State Retention Pulse-Triggered Flip-Flops with Scan and Reset Capabilities", since in the retention mode of operation the pulse generator is caused to no longer assert a pulse irrespective of changes in the clock signal. Performance is also improved when compared with that prior art, due to there being a reduced number of devices in the data path. In particular, no additional elements need to be inserted into the data path to achieve the required clock independent retention functionality, and accordingly the approach of the present invention provides a particularly simple and efficient mechanism for providing a clock independent retention storage structure.

In one embodiment, the circuit further comprises: at least one component which receives a voltage supply during a normal mode of operation, and has the voltage supply removed in a low power mode of operation such that an output of said at least one component becomes undefined during said low power mode of operation; and prior to entering said low power mode of operation, said retention control signal is asserted to cause said pulse generator to enter said retention mode of operation, such that when said low power mode of operation is entered the stored state in said storage element is unaffected by the output of said at least one component becoming undefined. There are a number of ways in which the output of the at least one component may become undefined. As an example, the output may transition to a particular logic level which is unknown, or may float at a voltage in between voltages representing defined logic levels. In accordance with the described embodiment, irrespective of how the output of the powered down component becomes undefined, the stored state within the storage element will remain unaffected, due to the retention mode having been entered prior to entering the low power mode of operation, and accordingly isolating the stored state of the storage element from the undefined output of the powered down component.

In one embodiment, the retention control signal continues to be asserted until after said low power mode has been exited to cause the voltage supply to be restored to said at least one component. Such an approach ensures that by the time the retention mode is exited, the output of the component(s) that had been powered down will have resumed a defined state.

The at least one component which has its voltage supply removed in the low power mode of operation can take a variety of forms. In one embodiment, the pulse generator includes a component which receives the retention control signal and one or more signals produced by clock distribution components. Some of the clock distribution components may be in the pulse generator itself, whilst others may be external to the pulse generator and used to handle the distribution of the clock signal prior to its receipt by the pulse generator. In such embodiments, the at least one component whose output becomes undefined during the low power mode of operation may comprise one or more of those clock distribution components.

In one particular embodiment, the at least one component whose output becomes undefined during said low power mode of operation comprises a delay component within the pulse generator used to generate a delayed version of the clock signal. Hence, in such embodiments it can be seen that even when part of the pulse generator itself has the voltage supply removed in the low power mode of operation, the required functionality of the storage structure is still maintained, since the part of the pulse generator which receives the retention control signal will not have been powered down, and accordingly the pulse generator will still not assert the pulse irrespective of changes in the clock signal during the retention mode of operation.

Another example of a component which can be powered down is an input handling component providing the input to the storage structure. Similarly, a yet further example of a component which can be powered down is an output handling component used to propagate an output from the storage structure. In practice, any or all of the input handling components, output handling components and the earlier mentioned clock distribution components may be powered down during the low power mode of operation. All that is required to ensure correct operation of the storage structure during the retention mode of operation is that, during the retention mode of operation, the pulse generator will not assert the pulse irrespective of changes in the clock signal, thereby ensuring that the isolation structure isolates the storage element from the input. During the retention mode of operation, the storage element itself will remain powered in order to ensure that its currently retained state is maintained, and the retention control signal must remain in the asserted state.

Separate to the issue of providing retention flip-flops, it is also known to provide pulsed flip-flops that are responsive to an enable signal. When the enable signal is de-asserted, this can cause the pulsed flip-flop to not update its stored state when the clock signal changes. When using the retention storage structure of embodiments of the present invention, it should be noted that that retention storage structure can also be arranged to operate as a pulsed storage structure with an enable facility. In particular, if the retention control signal is asserted without subsequently entering said low power mode of operation, said storage structure holds its stored state independent of changes in the clock signal, until the retention control signal is de-asserted. Hence, the same circuitry can be used to provide a clock independent pulse retention storage structure and a pulse storage structure with enable capability.

The pulse generator can take a variety of forms. However, in one embodiment, the pulse generator comprises delay circuitry for adding a delay to said clock signal, and combining circuitry for combining said clock signal and said delayed clock signal to generate said pulse dependent on said retention control signal. Typically, one of the clock signal and the delayed clock signal are inverted prior to inputting to the combining circuitry.

The isolation circuitry can take a variety of forms. However, in one embodiment, the isolation circuitry comprises a transmission gate, said input being provided to said transmission gate and said transmission gate being responsive to said asserted pulse to cause said storage element to update its stored state dependent on said input. However, the isolation circuitry need not be formed as a transmission gate. For example, in another embodiment, the isolation circuitry comprises a tristate inverter, said input being provided to said tristate inverter and said tristate inverter being responsive to said asserted pulse to cause said storage element to update its stored state dependent on said input.

The storage element may also take a variety of forms. However, in one embodiment the storage element comprises a latch circuit. In one particular embodiment, the latch circuit may be formed by a pair of back to back inverters, where the output of one inverter is connected to the input of the other inverter.

In an alternative embodiment, the latch element comprises an inverter and an inverting tri-stateable element, the output of the inverter being provided to the inverting tri-stateable element and the output of the tri-stateable element being provided to the inverter, said inverting tri-stateable element being configured only to be driven when said pulse is not asserted. The benefit of such an approach is that, whilst the isolation circuitry is driving the input into the storage element in response to the pulse being asserted, the inverting tri-stateable element is not being driven, this increasing the speed at which the updated state can be written into the storage element. Then when the pulse becomes de-asserted, the inverting tri-stateable element becomes driven in order to retain the state in the storage element, whilst the isolation circuitry is then not driven, thereby isolating the storage element from the input.

Whilst in one embodiment the storage element may be formed as a single ended write storage element such as the earlier-mentioned latch circuit, in an alternative embodiment the storage element may comprise a dual ended write storage element, with the isolation circuitry being coupled to both ends of the dual ended write storage element. One example of a suitable dual ended write storage element would be a 6 T SRAM storage element.

Viewed from a second aspect, the present invention provides a method of retaining state within a storage structure having a storage element for storing state and an isolation structure, the method comprising the steps of: operating a pulse generator in a non-retention mode of operation to periodically assert a pulse in response to a clock signal; responsive to said asserted pulse, using said isolation structure to cause said storage element to update its stored state dependent on an input to said storage structure; in the absence of said asserted pulse, using said isolation structure to isolate said storage element from said input; responsive to a retention control signal, causing said pulse generator to enter a retention mode of operation, during said retention mode of operation said pulse generator not asserting the pulse irrespective of changes in said clock signal; whereby said isolation structure isolates said storage element from said input during said retention mode of operation, causing said storage element to retain its stored state prior to entry of the retention mode of operation irrespective of changes in said clock signal or changes in said input during said retention mode of operation.

Viewed from a third aspect, the present invention provides a circuit comprising: pulse generating means for responding to a clock signal to periodically assert a pulse whilst in a non-retention mode of operation; storage means comprising a storage element means for storing state and an isolation means, said isolation means for responding to said asserted pulse to cause said storage element means to update its stored state dependent on an input to said storage means, and, in the absence of said asserted pulse, for isolating said storage element means from said input; responsive to a retention control signal, said pulse generating means for entering a retention mode of operation, during said retention mode of operation said pulse generating means not asserting the pulse irrespective of changes in said clock signal; whereby said isolation means isolates said storage element means from said input during said retention mode of operation, causing said storage element means to retain its stored state prior to entry of the retention mode of operation irrespective of changes in said clock signal or changes in said input during said retention mode of operation.

Viewed from a fourth aspect there is provided a non-transitory computer readable storage medium comprising cell library data including a cell definition for controlling a computer to generate an integrated circuit layout including a circuit in accordance with the first aspect of the present invention.

BRIEF DESCRIPTION OF THE DRAWINGS

The present invention will be described further, by way of example only, with reference to embodiments thereof as illustrated in the accompanying drawings, in which:

FIG. 9 illustrates use of a cell library including a cell definition describing the circuitry of one embodiment.

DESCRIPTION OF EMBODIMENTS

Figure 1:
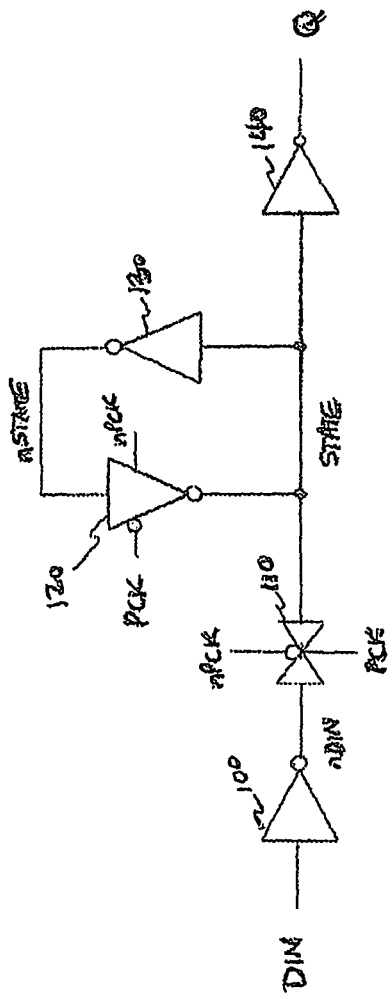
FIG. 1 shows a latch design suitable for use as a pulsed flip-flop in one embodiment.

FIG. 1 shows a typical pulsed flip-flop design (also referred to as a pulsed flop or a pulsed latch) suitable for use in one embodiment. The input DIN is inverted by inverter 100 and gated by transmission gate 110. The internal state of the flip-flop is maintained by cross coupled inverters 120 and 130. In this embodiment the inverter 120 actually takes the form of an inverting tri-stateable element. The output Q is driven to the correct polarity by inverter 140.

Clock inputs PCK and nPCK control the pass gate 110 and the inverting tri-stateable element 120. In particular, when PCK is high, nPCK will be low, and the pass gate 110 will transfer the signal nDIN to the inverter 130, maintaining or changing the state of the inverter 130 to match nDIN. At this time the inverting tri-stateable element 120 is turned off. When nPCK is high and PCK is low the pass gate is off and the inverting tri-stateable element 120 is turned on to maintain the current state of the flip-flop. By using an inverting tri-stateable element in such a way in place of a standard inverter, the writing of the updated state into the storage element can take place more quickly since the pass gate 110 does not need to drive against the inverting element 120.

Figure 2:
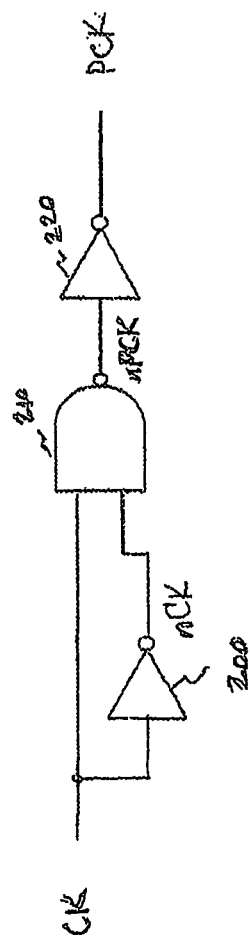
FIG. 2 illustrates a pulse generator that can be used to generate the PCK and nPCK signals required by the circuitry of FIG. 1.
Figure 4:
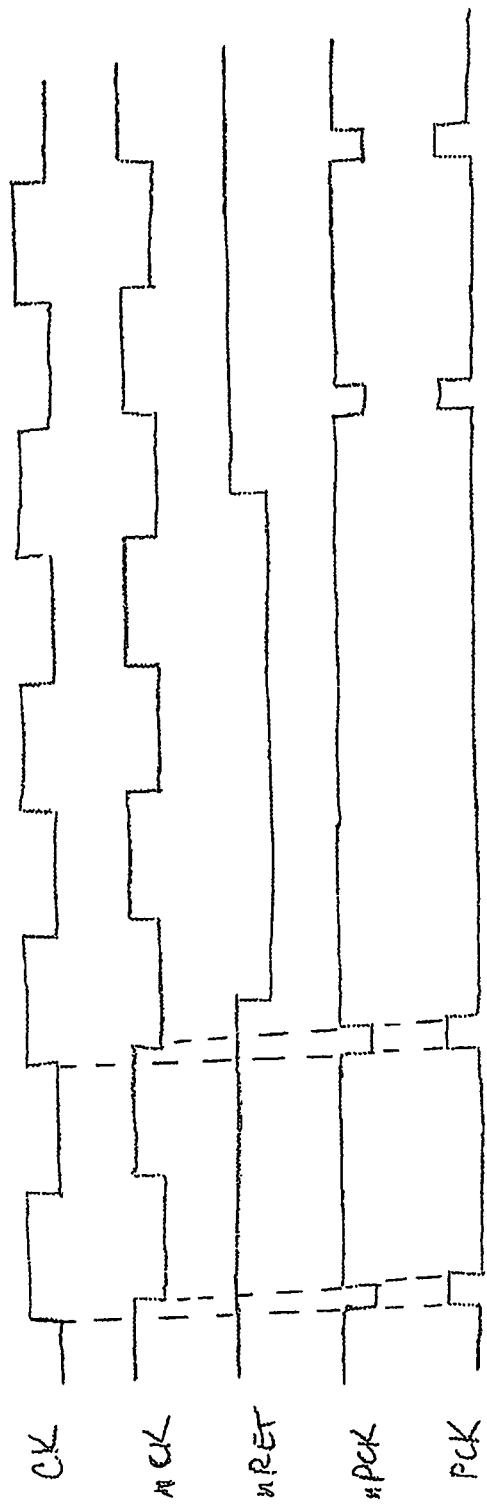
FIG. 4 illustrates the behaviour of the various signals shown in FIG. 3.

A pulse generator suitable for use with a pulse flip-flop to generate the signals PCK and nPCK is shown in FIG. 2. When the clock signal CK transitions from a low to a high state the inverter 200 delays the inverted CK signal (nCK) slightly causing NAND gate 210 to temporarily receive two logic one values at its input, causing it to generate a low pulse on the signal nPCK. In contrast, during the transition of CK from high to low the output of NAND gate 210 will not transition. The inverter 220 inverts nPCK generating PCK. The waveform for the signals in FIG. 2 are shown in FIG. 4 in the behaviour of the PCK and nPCK signals during the first two clock cycles of clock CK.

Figure 3:
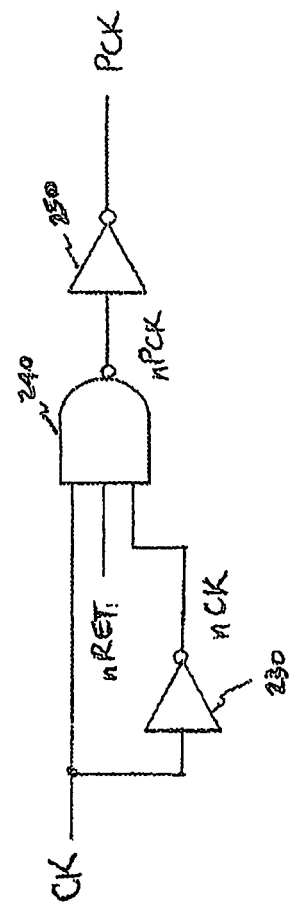
FIG. 3 illustrates a pulse generator in accordance with one embodiment.

However, the pulse generator of FIG. 2 does not support a retention mode. In FIG. 3 however, a pulse generation circuit suitable for use with one embodiment is shown, where an inverted retention signal, nRET, is used to support a retention mode of operation. When a retention signal. RET is asserted to cause a retention mode to be entered or maintained, the nRET signal will transition to a logic 0 value. The nRET signal is input to the NAND gate 240, and when the retention signal is not asserted (ie the nRET signal is a logic high) the NAND gate operates as discussed earlier with reference to FIG. 2. However, when the retention signal is asserted (i.e. the nRET is a logic low), the output of the NAND gate 240 is forced to a logic high level irrespective of the other inputs, and accordingly the output nPCK signal is at a logic high level. Thus the PCK signal output by the inverter 250 is at a logic low level. As a result, the pass gate 110 remains turned off irrespective of how the clock signal changes during the retention mode of operation, and the inverting tri-stateable element 120 remains turned on to hold the current state stored in the storage element. This property of the circuit is illustrated by the waveform diagram of FIG. 4, where the nPCK and PCK are clearly shown as not changing their values whilst the retention signal is asserted (nRET is at a logic low level).

In non-retention mode, the length of the pulse may be adjusted by the design of the delay elements represented by inverter 230. The delay elements may include an odd number of inverters rather than a single inverter. The generation of nCK must be such that nCK is the inversion of CK with the desired delay.

Figure 5:
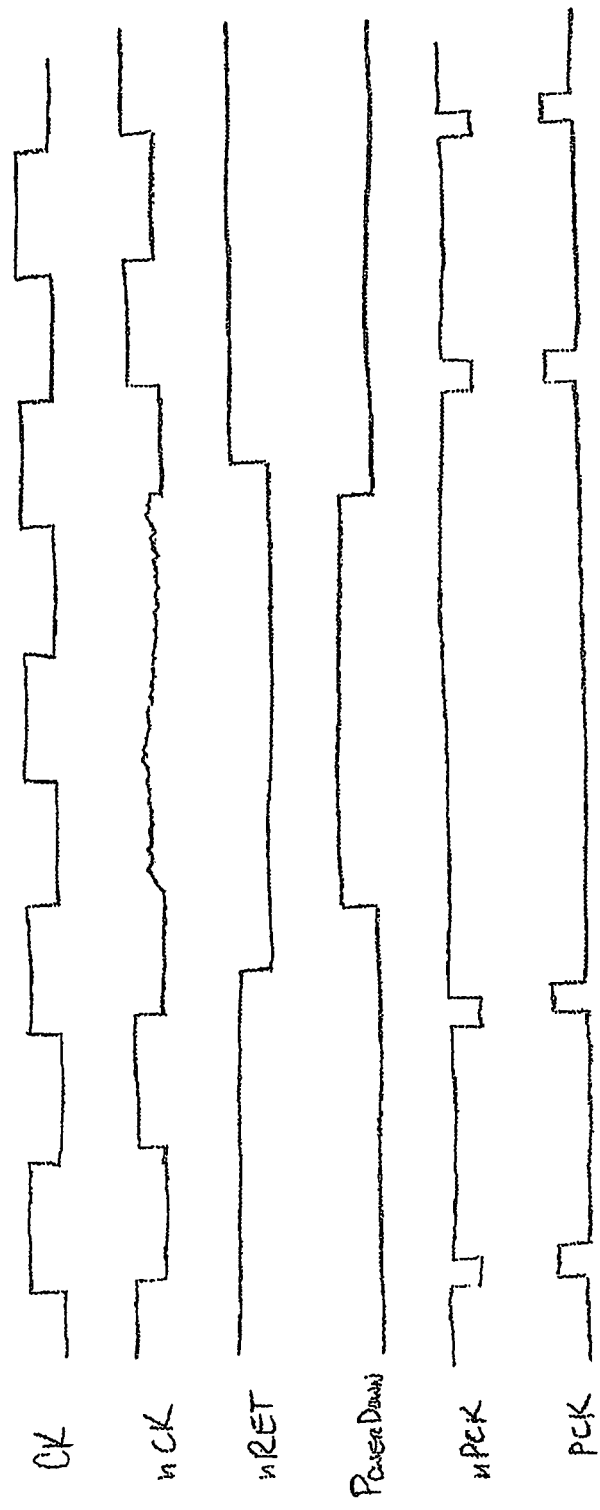
FIG. 5 illustrates how the introduction of the power down mode affects one of the clock signals without affecting the PCK and nPCK signals in accordance with one embodiment.

After the retention mode is entered the apparatus in which the pulsed flip-flop is provided will typically enter a low power mode of operation (also referred to herein as a power down mode). The behaviour of the clock signal nPCK and PCK during retention and power down mode is shown in FIG. 5. During power down mode various components may be powered down including some within the storage circuitry and/or pulse generator shown in FIGS. 1 and 3. For example, inverters 100 and 140 of FIG. 1, and/or the inverter 230 or the delay elements represented by inverter 230, may have the power removed and the signals output from these devices are allowed to go undefined (for example by floating between the positive power level and ground). This is shown schematically in FIG. 5 by the signal nCK floating during the period of time in which the signal "PowerDown" is asserted. Notice the output nPCK and PCK remain driven to predetermined levels during this time even though the input signal nCK is not driven.

Figure 6:
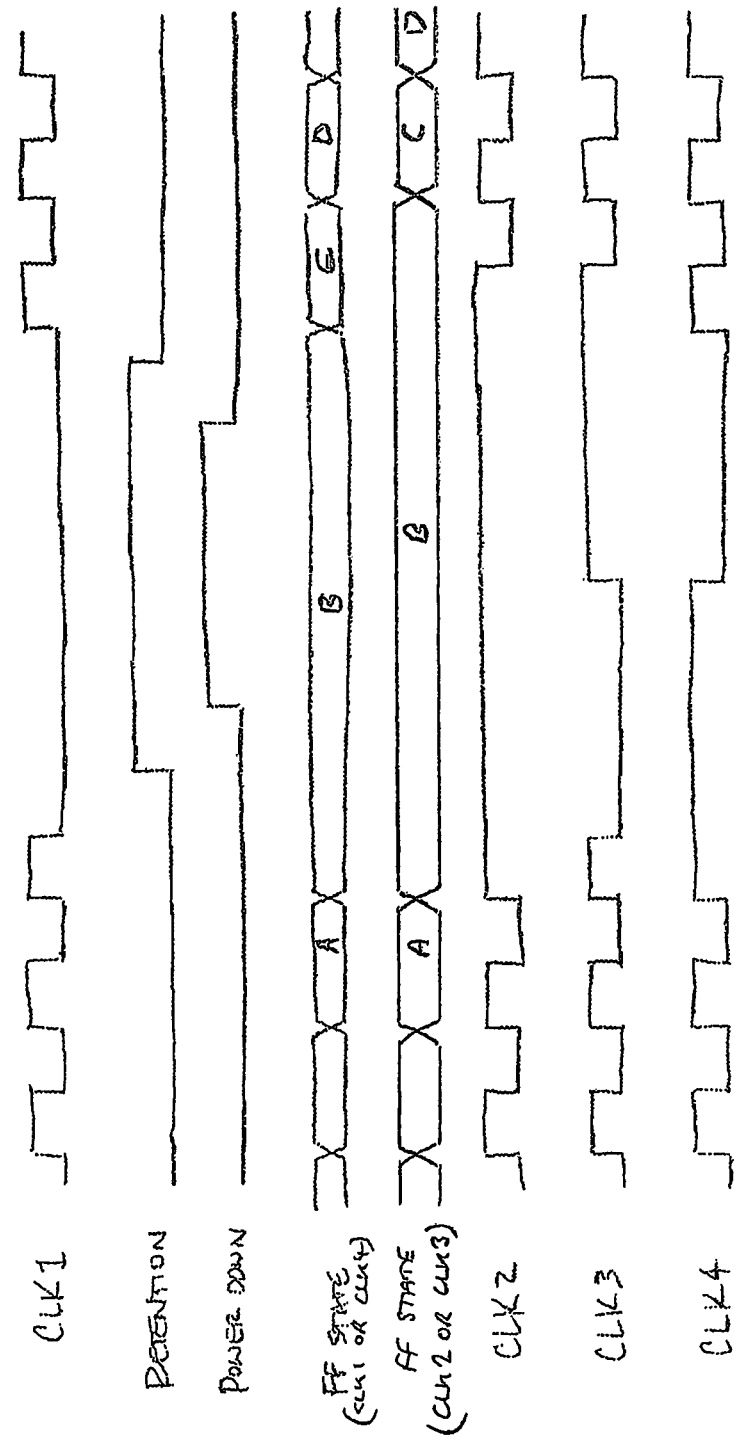
FIG. 6 illustrates how the design of one embodiment supports the four possible clock states for entry to and exit from the retention mode that are required to be supported by a clock independent retention flip flop.

As described above, a clock independent retention mode is defined as enterable during any state of the input clock and resistant to state changes in the presence of changes to the input clock. FIG. 6 shows four possible clock states and transitions which are allowed in a clock independent design (illustrated as clock signals CLK1, CLK2, CLK3 and CLK4, respectively). The signal CLK1 behaves as is common in a clock dependent design, in which the input clock is required to be at a low logic level before retention mode is entered. The clock is stopped in a low state before the assertion of the RETENTION signal. Further the clock is also held in the low state at the time the RETENTION signal is deasserted. CLK2 is similar to CLK1 but is stopped in a high state rather than a low state. CLK3 and CLK4 are analogous to CLK1 and CLK2 but incorporate a transition of the clock during the retention state. As shown by the signal FF STATE, the state of the flip-flop is maintained within the flip-flop during the retention mode. This state is designated by B, the state captured by the flip-flop at the last rising edge of the input clock before the stopping of the clock. As shown in FIG. 6, for the example clocks CLK2 or CLK3, the state B does not subsequently transition to state C until one cycle later than for the example clocks CLK1 or CLK4, due to the state not changing until the first rising edge of the clock after retention mode is exited.

It should be noted that the state B is also retained irrespective of whether the clock transitions an arbitrary number of times whilst the circuit is in the retention mode, or if the clock becomes undefined during the retention mode.

Figure 7:
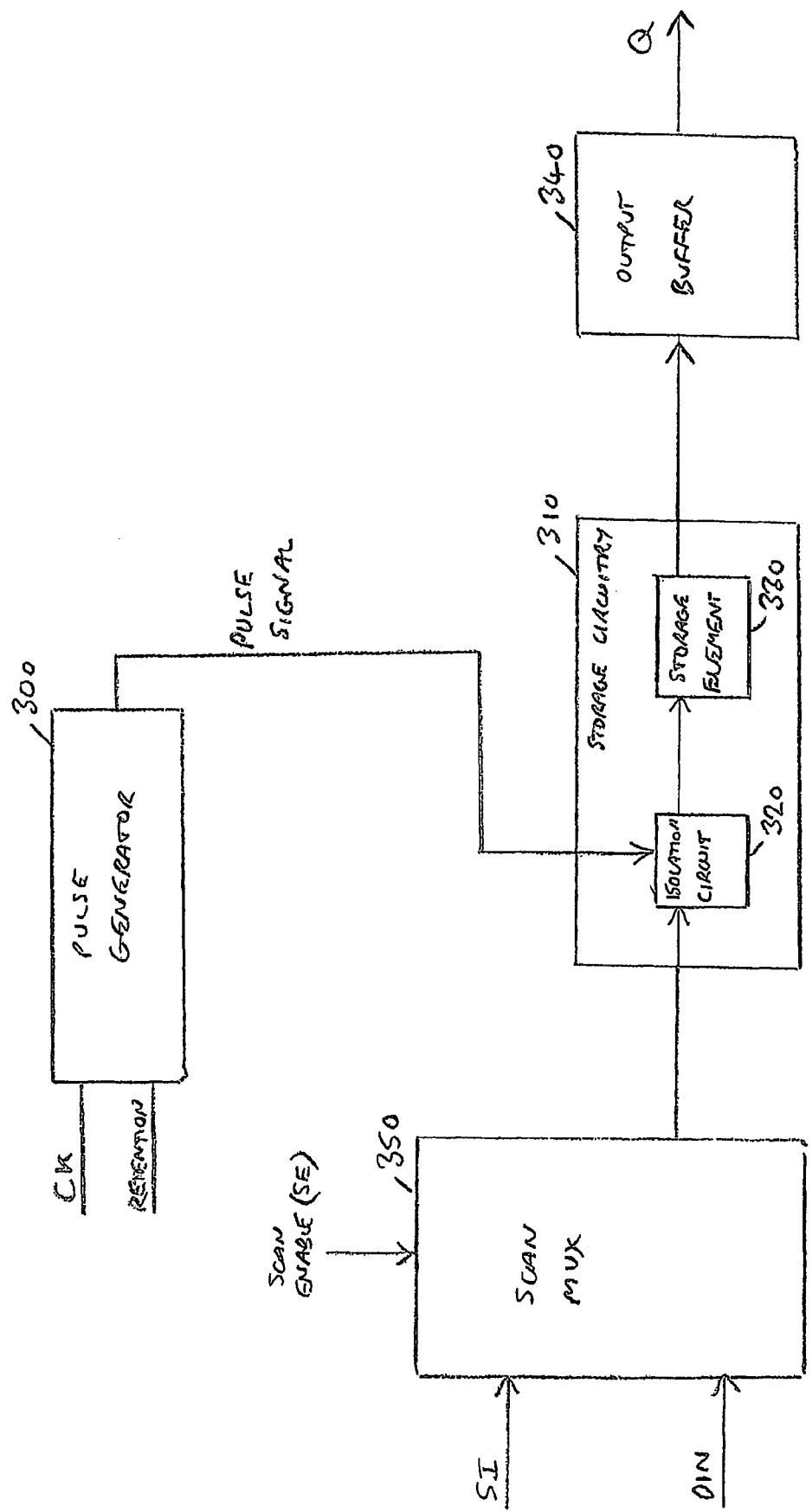
FIG. 7 is a block diagram illustrating the circuit of one embodiment.

FIG. 7 is a block diagram schematically illustrating a circuit in accordance with one embodiment. A pulse generator 300 is provided which generates a pulse signal from an input clock signal CK, provided that the RETENTION signal is not asserted. When the retention signal is asserted, no pulse is generated. The pulse generator may take a variety of forms, for example taking the form discussed earlier with reference to FIG. 3.

The pulse signal is provided to storage circuitry 310 consisting of an isolation circuit 320 and a storage element 330. In particular, when the pulse is asserted, the isolation circuitry passes a received input into the storage element, and when the pulse is not asserted the isolation circuitry isolates the storage element from the input. The storage circuitry can take a variety of forms but in one embodiment takes the form discussed earlier in FIG. 1.

Optionally, the circuit may include scan circuitry to allow data to be input into the storage circuitry in a scan mode of operation. There are a number of known techniques for integrating scan into flip flop designs, and any suitable mechanism may be used. In the embodiment shown in FIG. 7, a scan multiplexer 350 is provided for selectively providing either the data in (DIN) data or the scan in (SI) data to the storage circuitry 310 in dependence on a scan enable (SE signal). In particular, if the scan enable signal is not asserted, the circuitry operates normally and the data DIN is provided to the storage circuitry. However, if the SE signal is asserted, a scan mode of operation is entered where the scan data SI is input to the storage circuitry 310.

Whilst the example of FIG. 7 shows the use of an embodiment incorporating a scan design, embodiments of the invention can also be used in a non-scan design.

As also shown in FIG. 7 one or more output buffers stages 340 may optionally be provided for buffering the signal output from the storage circuitry before output as output signal Q. Additionally, although not shown, one or more input buffer stages may optionally be provided between the scan multiplexer 350 and the storage circuitry 310 if desired.

Figure 8:
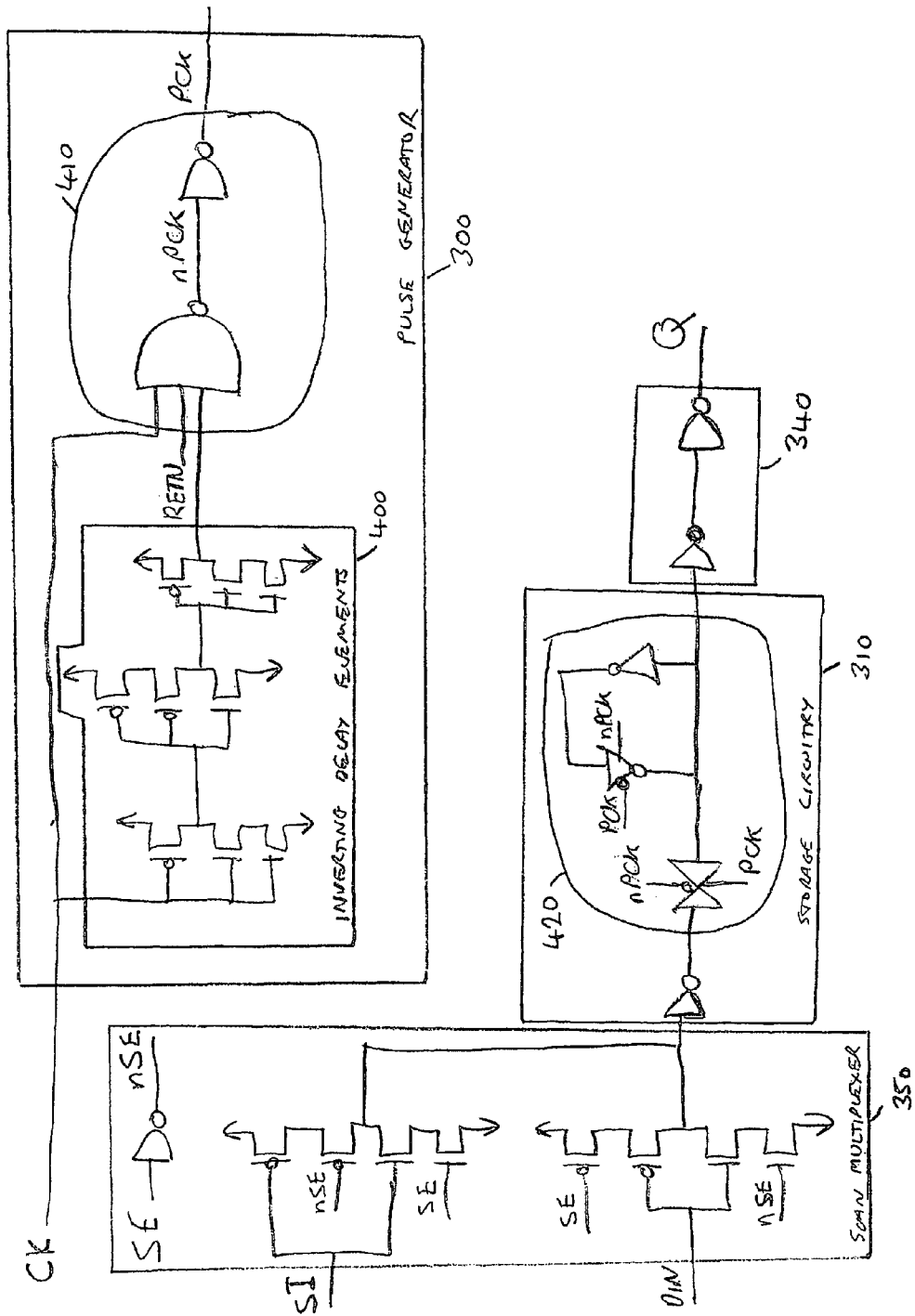
FIG. 8 is a detailed schematic of one embodiment of the circuit of FIG. 7.

FIG. 8 illustrates a gate/transistor level design for the circuit of FIG. 7 in accordance with one embodiment. As can be seen, in this example, the storage circuitry 310 takes the form of the circuit discussed earlier with reference to FIG. 1. The pulse generator 300 also takes the form of the pulse generator shown in FIG. 3, with the exception that the inverter 230 of FIG. 3 is replaced by the series of inverting elements 400. The components within the pulse generator 300 and storage circuitry 310 circled by the lines 410, 420, respectively, represent the minimum number of components which need to remain powered during the low power mode of operation to ensure that the circuit operates as a clock independent retention flip-flop.

It will be appreciated that the gate/transistor level design shown in FIG. 8 represents merely one example of how the circuit of FIG. 7 could be constructed and it will be apparent to those skilled in the art that various modifications could be made to the design whilst still achieving the defined functionality.

The above described designs are also compatible with traditional methods of asynchronously setting or resetting the latch element. In addition, it is possible to combine this technique with traditional enable pulse flip-flop techniques as well. In particular, if the retention control signal is asserted without subsequently entering the low power mode of operation, the storage structure holds its stored state independent of changes in the clock signal, until the retention control signal is de-asserted. Hence, the same circuitry can be used to provide a clock independent pulse retention storage structure and a pulse storage structure with enable capability.

Whilst hardware designs incorporating the above described circuitry may be produced, it is also possible to include the above described design of clock independent pulse retention flip-flop as a cell definition within a cell library. In particular, as shown in FIG. 9, a cell library including cell definitions for a variety of circuit elements may be provided as an input to a computer running EDA software 540 in order to produce layout designs. In such an embodiment, an RTL definition 510 of a desired integrated circuit will also be input to the computer, with the EDA software using the cell definitions to produce an integrated circuit layout 550 that meets the specified RTL definition. One of the cell definitions may describe a clock independent pulse retention flip-flop circuit of an embodiment of the present invention.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A circuit comprising:
a pulse generator configured in a non-retention mode of operation to be responsive to a clock signal to periodically assert a pulse;
a storage structure comprising a storage element for storing a state and an isolation structure, said isolation structure being responsive to said asserted pulse to cause said storage element to update said stored state dependent on an input to said storage structure, and in the absence of said asserted pulse to isolate said storage element from said input, said pulse generator is responsive to a retention control signal to enter a retention mode of operation, during said retention mode of operation said pulse generator is configured to not assert the pulse irrespective of changes in said clock signal, whereby said isolation structure isolates said storage element from said input during said retention mode of operation, causing said storage element to retain said stored state prior to entry of the retention mode of operation irrespective of changes in said clock signal or changes in said input during said retention mode of operation; and
at least one component which receives a voltage supply during a normal mode of operation, and has the voltage supply removed in a low power mode of operation such that an output of said at least one component becomes undefined during said low power mode of operation, wherein, prior to entering said low power mode of operation, said retention control signal is asserted to cause said pulse generator to enter said retention mode of operation, such that when said low power mode of operation is entered the stored state in said storage element is unaffected by the output of said at least one component becoming undefined.

2. A circuit as claimed in claim 1, wherein:
said retention control signal continues to be asserted until after said low power mode has been exited to cause the voltage supply to be restored to said at least one component.

3. A circuit as claimed in claim 1, wherein:
said pulse generator includes a component which receives said retention control signal and one or more signals produced by clock distribution components; and
said at least one component whose output becomes undefined during said low power mode of operation comprises at least one of said clock distribution components.

4. A circuit as claimed in claim 3, wherein said at least one component whose output becomes undefined during said low power mode of operation comprises a delay component within the pulse generator used to generate a delayed version of the clock signal.

5. A circuit as claimed in claim 1, wherein said at least one component comprises at least one of an input handling component providing said input to said storage structure and an output handling component used to propagate an output from said storage structure.

6. A circuit as claimed in claim 1, wherein:
if said retention control signal is asserted without subsequently entering said low power mode of operation, said storage structure holds its stored state independent of changes in the clock signal, until the retention control signal is de-asserted.

7. A circuit as claimed in claim 1, wherein:
said pulse generator comprises delay circuitry for adding a delay to said clock signal, and combining circuitry for combining said clock signal and said delayed clock signal to generate said pulse dependent on said retention control signal.

8. A circuit as claimed in claim 7, wherein one of the clock signal and said delayed clock signal are inverted prior to input to the combining circuitry.

9. A circuit as claimed in claim 1, wherein said isolation circuitry comprises a transmission gate, said input being provided to said transmission gate and said transmission gate being responsive to said asserted pulse to cause said storage element to update its stored state dependent on said input.

10. A circuit as claimed in claim 1, wherein said isolation circuitry comprises a tristate inverter, said input being provided to said tristate inverter and said tristate inverter being responsive to said asserted pulse to cause said storage element to update its stored state dependent on said input.

11. A circuit as claimed in claim 1, wherein said storage element comprises a latch circuit.

12. A circuit as claimed in claim 11, wherein the latch element comprises an inverter and an inverting tri-stateable element, the output of the inverter being provided to the inverting tri-stateable element and the output of the tri-stateable element being provided to the inverter, said inverting tri-stateable element being configured only to be driven when said pulse is not asserted.

13. A circuit as claimed in claim 1, wherein said storage element comprises a dual ended write storage element, with the isolation circuitry being coupled to both ends of the dual ended write storage element.

14. A method of retaining state within a storage structure having a storage element for storing a state and an isolation structure, the method comprising the steps of:
- operating a pulse generator in a non-retention mode of operation to periodically assert a pulse in response to a clock signal;
- responsive to said asserted pulse, using said isolation structure to cause said storage element to update said stored state dependent on an input to said storage structure;
- in the absence of said asserted pulse, using said isolation structure to isolate said storage element from said input;
- responsive to a retention control signal, causing said pulse generator to enter a retention mode of operation, during said retention mode of operation said pulse generator not asserting the pulse irrespective of changes in said clock signal, whereby said isolation structure isolates said storage element from said input during said retention mode of operation, causing said storage element to retain said stored state prior to entry of the retention mode of operation irrespective of changes in said clock signal or changes in said input during said retention mode of operation;
- at least one component receives a voltage simply during a normal mode of operation, and has the voltage supply removed in a low power mode of operation such that an output of said at least one component becomes undefined during said low power mode of operation; and
- prior to entering said low power mode of operation, said retention control signal is asserted to cause said pulse generator to enter said retention mode of operation, such that when said low power mode of operation is entered the stored state in said storage element is unaffected by the output of said at least one component becoming undefined.

15. A circuit comprising:
- pulse generating means for responding to a clock signal to periodically assert a pulse whilst in a non-retention mode of operation;
- storage means comprising a storage element means for storing a state and an isolation means for responding to said asserted pulse to cause said storage element means to update said stored state dependent on an input to said storage means, and, in the absence of said asserted pulse, for isolating said storage element means from said input;
- responsive to a retention control signal, said pulse generating means for entering a retention mode of operation, during said retention mode of operation said pulse generating means not asserting the pulse irrespective of changes in said clock signal; whereby said isolation means isolates said storage element means from said input during said retention mode of operation, causing said storage element means to retain said stored state prior to entry of the retention mode of operation irrespective of changes in said clock signal or changes in said input during said retention mode of operation; and
- at least one component which receives a voltage supply during a normal mode of operation, and has the voltage supply removed in a low power mode of operation such that an output of said at least one component becomes undefined during said low power mode of operation, and prior to entering said low power mode of operation, said retention control signal is asserted to cause said pulse generating means to enter said retention mode of operation, such that when said low power mode of operation is entered the stored state in said storage means is unaffected by the output of said at least one component becoming undefined.

16. A non-transitory computer readable storage medium comprising cell library data including a cell definition for controlling a computer to generate an integrated circuit layout including a circuit as claimed in claim 1.

* * * * *